(12) United States Patent
Kanskar (10) Patent No.: US 9,673,591 B2
(45) Date of Patent: Jun. 6, 2017

(54) WAVELENGTH LOCKING MULTIMODE DIODE LASERS WITH FIBER BRAGG GRATING IN LARGE MODE AREA CORE

(71) Applicant: nLIGHT Photonics Corporation, Vancouver, WA (US)

(72) Inventor: Manoj Kanskar, Portland, OR (US)

(73) Assignee: nLIGHT, INC., Vancouver, WA (US)

( * ) Notice: Subject to any disclaimer, the term of this patent is extended or adjusted under 35 U.S.C. 154(b) by 0 days.

(21) Appl. No.: 14/986,545

(22) Filed: Dec. 31, 2015

(65) Prior Publication Data

US 2016/0226220 A1    Aug. 4, 2016

Related U.S. Application Data

(63) Continuation-in-part of application No. 13/897,216, filed on May 17, 2013, now Pat. No. 9,496,683.

(51) Int. Cl.

| | |
|---|---|
| *H01S 5/06* | (2006.01) |
| *H01S 5/065* | (2006.01) |
| *H01S 5/068* | (2006.01) |
| *G02B 6/00* | (2006.01) |
| *H01S 5/40* | (2006.01) |
| *H01S 3/08* | (2006.01) |
| *H01S 5/028* | (2006.01) |
| *H01S 5/14* | (2006.01) |

(52) U.S. Cl.
CPC ............ *H01S 5/0653* (2013.01); *G02B 6/00* (2013.01); *H01S 5/068* (2013.01); *H01S 5/0657* (2013.01); *H01S 5/147* (2013.01); *H01S 5/4062* (2013.01); *H01S 5/4068* (2013.01); *H01S 3/08009* (2013.01); *H01S 3/08045* (2013.01); *H01S 5/0287* (2013.01); *H01S 5/141* (2013.01)

(58) Field of Classification Search
CPC ...... H01S 5/0657; H01S 5/0653; H01S 5/068; H01S 5/02284; H01S 5/02288; H01S 5/146; H01S 5/4025; H01S 3/08009
See application file for complete search history.

(56) References Cited

U.S. PATENT DOCUMENTS 6,574,262 B1 * 6/2003 Dautremont-Smith . H01S 5/146
372/101

* cited by examiner

*Primary Examiner* — Armando Rodriguez (57) ABSTRACT

According to another aspect of the present disclosed technology, a diode laser assembly, includes an optical fiber having a cladding and a large mode area (LMA) core, wherein the LMA core comprises a fiber Bragg grating disposed within the LMA core, a plurality of diode lasers configured to emit light, optics configured to receive the light and to couple the light into the LMA core, and one or more features in the optical fiber to couple higher order modes of the light leaving substantially single mode light to propagate in the LMA core wherein a portion of the single mode light propagating in the LMA core is reflected by the fiber Bragg grating and is coupled back through the optics into the plurality of diode lasers to lock the wavelength of light emitted from each diode laser of the plurality.

18 Claims, 6 Drawing Sheets

WAVELENGTH LOCKING MULTIMODE DIODE LASERS WITH FIBER BRAGG GRATING IN LARGE MODE AREA CORE

CROSS REFERENCE TO RELATED APPLICATION

This is a continuation-in-part of U.S. Non-provisional application Ser. No. 13/897,216 filed on May 17, 2013 which is hereby incorporated by reference in its entirety.

BACKGROUND OF THE DISCLOSED TECHNOLOGY

1. Field of the Disclosed Technology

Generally, the field of the present disclosed technology is wavelength locking diode lasers. More particularly, the present disclosed technology relates to the wavelength locking diode lasers with fiber Bragg gratings.

2. Background

There are several on-chip wavelength locking methods for semiconductor lasers, such as built-in diffraction gratings providing distributed feedback or forming distributed Bragg gratings. Similarly, surface and volume grating have been used to wavelength-lock multiple semiconductor lasers in an external cavity configuration. Surface grating wavelength-locking techniques tend to be highly sensitive to environmental changes. For example, volume gratings have finite absorption in the glass due to impurities introduced for photo-sensitizing purposes which leads to self-heating. As a result, emission wavelength shifts due to glass heating. The amount of heating becomes more significant at larger powers, for example, over 200 W, impinges on the gratings, or as power settings change. As grating temperature increases, the associated Bragg resonance wavelength shifts, making it unwieldy in applications demanding tight center wavelength tolerance. Accordingly, a need remains for wavelength selective methods and devices without these and other attendant drawbacks.

SUMMARY OF THE DISCLOSED TECHNOLOGY

According to one aspect of the present disclosed technology, a wavelength locking diode laser apparatus is provided which includes an optical fiber having a multi-mode inner cladding and a core, the core having a fiber Bragg grating disposed therein, a plurality of diode lasers configured to emit respective laser beams, and optics configured to receive the laser beams and to couple the laser beams into the optical fiber wherein a portion of the laser light coupled into the optical fiber is reflected by the fiber Bragg grating and is coupled back through the optics into the plurality of diode lasers so as to lock the wavelength of light emitted therefrom.

According to another aspect of the present disclosed technology, a wavelength locked semiconductor laser apparatus includes an optical fiber including a single mode core, a multi-mode inner cladding, and an outer cladding, the single mode core including a fiber Bragg grating written therein, a plurality of semiconductor diode lasers configured to emit respective semiconductor laser beam, collimation optics for collimating the semiconductor laser beams emitted by the plurality of semiconductor diode lasers, an objective lens configured to receive the collimated semiconductor laser beams and to direct the semiconductor laser beams into the multi-mode inner cladding of the optical fiber for propagation therein, wherein a portion of the light propagating through the multi-mode inner cladding is reflected by the fiber Bragg grating and propagates back through the single mode core, objective lens, and collimation optics, and into each diode laser of the plurality of diode lasers such that the wavelength of each diode laser is narrowed to a wavelength associated with a reflectivity characteristic of the fiber Bragg grating.

According to another aspect of the present disclosed technology, a diode laser assembly, includes an optical fiber having a cladding and a large mode area (LMA) core, wherein the LMA core comprises a fiber Bragg grating disposed within the LMA core and not in the cladding, a plurality of diode lasers configured to emit light, optics configured to receive the light and to couple the light into the LMA core, and one or more features in the optical fiber to couple higher order modes of the light leaving substantially single mode light to propagate in the LMA core wherein a portion of the single mode light propagating in the LMA core is reflected by the fiber Bragg grating and is coupled back through the optics into the plurality of diode lasers to lock the wavelength of light emitted from each diode laser of the plurality. In some examples, the portion of light reflected by the fiber Bragg grating is proportional to the ratio of the diameter of the LMA core to the diameter of the optical fiber. The plurality of diode lasers may be wavelength locked at a center wavelength of the fiber Bragg grating and with a full width half maximum of greater than 0 nm and less than 1 nm. The portion of light that is reflected by the core fiber Bragg grating may be between 0.1% and 20% percent of the light coupled into the optical fiber. The plurality of diode lasers may comprise a plurality of single-emitter diode lasers. In some examples, the portion of light that is reflected by the LMA core fiber Bragg grating and is coupled into the plurality of single-emitter diode lasers is not equally distributed among each of the diode lasers. The plurality of diode lasers may comprise a bar of diode lasers. The optical fiber can include a plurality of fiber Bragg gratings concatenated in the LMA core. The optical fiber may include a side core wound in a helix around the LMA core to couple out higher order modes of the light. The optical fiber may include holes distributed around the LMA core to couple out higher order modes of the light. The optical fiber can be tapered to couple out higher order modes of the light, bent to induce higher order mode losses, and/or bent to induce higher order mode losses. In some examples, the optical fiber includes a first section comprising a side core wound in a helix around the LMA core to couple higher order modes of the light and a second section comprising a fiber having a LMA core, wherein the fiber Bragg grating is written into the LMA core and not in the LMA core in the first section. In some examples, the optical fiber includes a first section comprising a tapered portion, wherein the tapered portion is on an input side and tapers from a larger diameter to a smaller diameter to couple out higher order modes of the light and a second section comprising a fiber having a LMA core, wherein the fiber Bragg grating is written into the LMA core and not in the LMA core in the first section. The optics can include a fast axis collimator and slow axis collimator optically coupled to each diode laser of the plurality of single-emitter diode lasers for collimating the laser beams emitted therefrom, and the optics include a Fourier transform lens for receiving the collimated laser beams and coupling the laser beams into an input face of the optical fiber. The wavelength of the plurality of diode lasers may be adjusted to be narrower than the plurality diode lasers operating without a wavelength locking mechanism.

The fiber Bragg grating may have a reflectivity spectrum of greater than 0 nm and less than or equal to 1 nm. The optical fiber can provide wavelength locking of the plurality of diode lasers without wavelength drift at incident powers. The core can be a single mode or few mode core.

The foregoing and other objects, features, and advantages will become more apparent from the following detailed description, which proceeds with reference to the accompanying figures which may not be drawn to scale.

DETAILED DESCRIPTION OF THE DISCLOSED TECHNOLOGY

Figure 1:
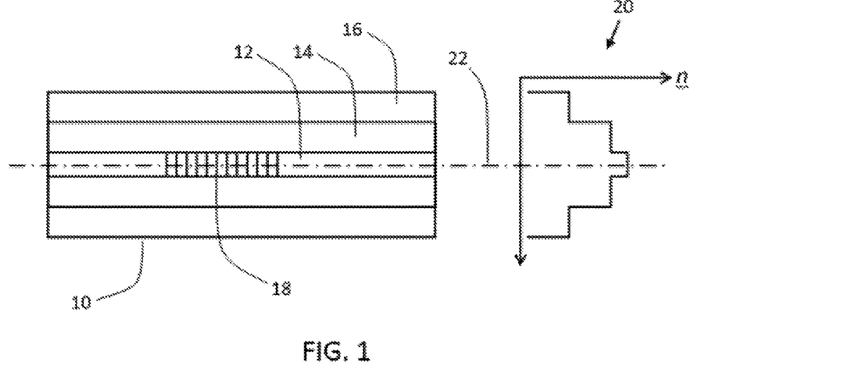
FIG. 1 is a side cross-sectional view of an optical fiber and associated refractive index profile in accordance with an aspect of the present disclosed technology.

Referring now to FIG. 1, an optical fiber 10 is shown in cross-section in accordance with an aspect of the present disclosed technology. The optical fiber 10 includes a core 12 longitudinally disposed in a middle of the optical fiber 10. The core 12 is surrounded by a first cladding 14. In typical embodiments, the optical fiber 10 is a double clad fiber that includes at least a second cladding 16 surrounding the first cladding 14. The second cladding 16 has a lower refractive index than the first cladding 14 allowing total internal refraction of light of relatively low brightness that is coupled into and propagating through the first cladding 14. The optical fiber 10 also includes a fiber Bragg grating 18 disposed in the core 12, but not in the surrounding first cladding 14 or second cladding 16. The fiber Bragg grating 18 has a reflectivity characteristic such that it is operable to selectively reflect light of a particular wavelength or wavelength ranges that is incident thereon. To the right of the optical fiber 10 in FIG. 1 is a sideways oriented plot of an example cross-sectional refractive index profile 20 of the optical fiber 10 along an axis transverse to a longitudinal axis 22 of the optical fiber 10. The example refractive index profile 20 is exaggerated to show the differences between the core 12 and claddings 14, 16.

Figure 2:
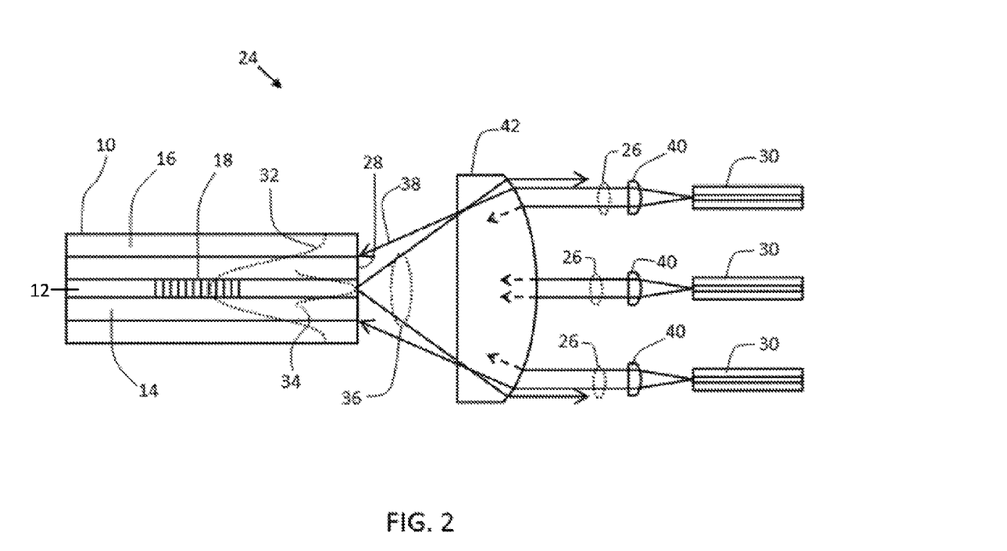
FIG. 2 is a schematic of a wavelength locked laser system in accordance with another aspect of the present disclosed technology.

Referring now to FIG. 2, a schematic of a wavelength selective apparatus 24 is shown in accordance with another aspect of the present disclosed technology. The wavelength selective apparatus 24 includes the optical fiber 10 of FIG. 1 situated to receive multimode semiconductor laser beams 26 optically coupled into a fiber input surface 28 of the optical fiber 10. The semiconductor laser beams 26 are produced by optical sources, such as single-emitter semiconductor diode lasers gain blocks 30. Guided by total internal reflection, the multimode light that has been coupled into the fiber 10, designated generally by left facing dashed line 32, propagates through the core 12 and first cladding 14 therein. In typical embodiments, the fiber Bragg grating 18 disposed in the core 12 has a narrow reflection band, such as greater than 0 nm but less than or equal to about 1 nm and is operable to reduce the bandwidth of the optical sources providing the semiconductor laser beams 26, which is typically 2 nm to 3 nm wide when running freely in a Fabry-Perot configuration without the aid of some wavelength narrowing mechanism.

In preferred examples, the core 12 is a single mode core or few-mode core (e.g., 5 or fewer transverse modes). Hereinafter, core 12 may be referred to as a single mode core though it will be appreciated that such term can encompass few-mode core variations. By locating the fiber Bragg grating 18 in the single mode core 12, a non-degenerate Bragg condition is ensured. That is, multimode laser light 32 that is guided in the multimode core 12 and first cladding 14 has numerous propagation constants and associated effective indexes for various guided optical modes. Each of the modes has an overlap with the central single mode core 12. Therefore, each of the modes excites a single mode with a single propagation constant inside the single mode core 12. Hence, the reflected wave, designated generally by right facing dashed line 34, from the fiber Bragg grating 18 satisfies the condition given by the equation:

$$\lambda_{vacuum} = 2n_{eff}\Lambda_{grating}$$

where $\lambda_{vacuum}$ is the wavelength in vacuum, $n_{eff}$ is the effective index of the light inside the single mode core 12 and $\Lambda_{grating}$ is the pitch of the grating 18.

Since the cross-sectional area of the single mode core 12 of the optical fiber 10 is a small fraction of the multimode cross-sectional area associated with the first cladding 14, a corresponding small fraction is converted to single mode light. A fraction of the single mode light is reflected from the fiber Bragg grating 18 to become the reflected single mode light 34, depending on the reflectivity of the grating 18. In general, approximately a fraction denoted by ($\alpha \times R/A$) is the amount of light that becomes the reflected wave 34, where $\alpha$ is the cross-sectional area of the single mode core 12, R is the reflectivity of the fiber Bragg grating 18, and A is the cross-sectional area of the core 12 and cladding 14.

The reflected wave 34 has a narrow spectral band attributable to the characteristics of the fiber Bragg grating 18 and has a single spatial transverse mode due to the refractive index and diameter of the core 12. The reflected wave 34 is then emitted from the input surface 28 of the optical fiber 10 as a narrow band single mode beam 36. For clarity, single mode beam 36 is shown with marginal rays thereof having right facing arrows. A multimode light beam 38, which is coupled into the input surface 28 of the optical fiber 10, is shown with outer marginal rays thereof having left facing arrows at the input surface 28. The multimode light beam 38 typically includes a plurality of multimode light beams 26, emitted by the respective multimode semiconductor laser gain blocks 30, in single-emitter, bar, or other configuration.

By coupling a portion or the entire reflected wave 34, which has a narrower spectral band, into the corresponding gain blocks 30, the wavelengths of light emitted by the gain blocks 30 can be locked. Herein wavelength locking refers to the narrowing of a spectral band of associated gain blocks in an unlocked configuration and also to selecting or adjusting the wavelength of the corresponding light emitted by associated gain blocks.

In many embodiments the multimode light beams 26 are collimated across one or more transverse propagation axes by collimation optics 40, such as cylindrical lens slow axis collimators or fast axis collimators. The multimode light beams 26 are coupled into the input surface 28 of the optical fiber 10 with a Fourier transform lens 42, such as an objective lens. Thus, the side view of the apparatus 24 in FIG. 2 can be understood as showing one orthogonal direction of the laser gain blocks 30 and corresponding the collimation optics as either slow or fast axis collimators, with distances between collimation optics 40 and gain blocks 30 and distances between collimation optics 40 and transform lens 42 being configured accordingly. The schematic looks similar in the other orthogonal direction except the aforementioned distances may be configured differently, such as providing collimation optics 40 with a different focal length.

The narrow band single mode beam 36 emitted from the input surface 28 is optically coupled to the lens 42 and is Fourier transformed to provide feedback to multiple multimode semiconductor laser gain blocks 30. For example, portions of the single mode beam 36 are received by the collimation optics 40 and coupled into anti-reflective coated input facets of the gain blocks 30. Other portions of the single mode beam 36 may miss the collimation optics 40 and not get coupled into the gain blocks 30. The back facets of the semiconductor laser gain blocks 30 are preferably highly reflectively coated. The input surface 28 is preferably anti-reflective coated. The diode laser beams 26 can be of arbitrary size depending on the telescopes used. Moreover, various diode configurations are possible, such as reflected, multiplexed, etc., and different coupling methods are appreciated to be within the scope of aspects of the present disclosed technology.

Accordingly, apparatuses in accordance with aspects of the present disclosed technology achieve wavelength locking of semiconductor laser gain blocks 30 by back-reflecting a portion of the light emitted therefrom with a fiber Bragg grating 18 disposed in a single mode core 12 of a section of optical fiber 10. A portion of the back-reflected light is coupled back into the gain blocks 30 and the wavelengths thereof are adjusted. Optical fibers in accordance with aspects of the present disclosed technology are configured with a single mode core and a first cladding 14 surrounding the single mode core 12. In some embodiments the core 12 may be offset or have different shapes. The core 12 has a fiber Bragg grating 18 disposed therein, which can be achieved through conventional methods of writing periodic shapes in the core 12. The fiber Bragg grating 18 is thus configured to reflect a portion of pump light propagating in the of optical fiber 10 so as to propagate reflected portion backwards through the single mode core 12 and back into associated gain blocks 30 for locking or narrowing the wavelength of light emitted therefrom.

Thus, in preferred examples, multimode light emitted by diode laser gain blocks 30 is collimated and incident on a Fourier transform lens 42. This light is coupled into a multimode optical fiber 10 to be used as pump light for various applications, such as solid state laser or fiber laser pumping. The guided modes of the pump light propagating in the optical fiber 10 have an overlap with the single mode core 12 of the optical fiber 10. Therefore, single mode pump light is generated inside the core 12 in the forward direction. The single mode pump light encounters the fiber Bragg grating 18 in the single mode core 12 and a portion thereof is reflected to become backwards propagating single mode pump light. The backwards propagating single mode pump light 34 is then emitted from the optical fiber 10 and is optically coupled via the Fourier transform lens 42 and collimation optics 40 back into the diode laser gain blocks 30. Since the spectral width of the backwards propagating light is narrow, e.g., less than 1 nm or narrower, as determined by the characteristics of the fiber Bragg grating 18, the diode gain blocks 30 become injection locked to the center wavelength of the fiber Bragg grating 18.

Thus, wavelength locking of gain blocks 30 can be achieved without the use of conventional externally or internally disposed elements, such as volume Bragg gratings or distributed feedback elements. Use of such elements can typically experience undesirable heating which can result in wavelength drift of the locked wavelength of the gain blocks 30 as a function of temperature or diode power. For example, in externally disposed VBG arrangements, as diode powers increase from just a few Watts to tens or several tens of Watts, the VBG element increases in temperature and the locked wavelength of the gain blocks 30 becomes longer and the linewidth broadens, typically in the range of picometers to hundreds of picometers. Thus, elimination of such elements that experience heating can also eliminate or mitigate the wavelength drift associated therewith.

As noted above, the cross-sectional area of the single mode core 12 of the optical fiber 10 is a small fraction of the multimode cross-sectional area associated with the first cladding 14. A corresponding small fraction of light propagating in optical fiber 10 is converted to single mode light. A fraction of this single mode light is reflected from the fiber Bragg grating 18 to become the reflected single mode light 34 which is coupled via the Fourier transform lens 42 and collimation optics 40 back into the diode laser gain blocks 30. The magnitude of the single mode light 34 is denoted by ($\alpha \times R/A$). Thus, the magnitude of feedback is limited in the foregoing examples by the ratio of the area of the single mode core to area of the single mode core and outer cladding. In order to overcome these limitations and increase the magnitude of the light reflected back to the diode laser gain blocks 30, a fiber Bragg grating may be written into the core of a large mode area (LMA) single mode fiber. Examples of large mode area single mode fibers include: LMA fibers designed with bends to induce bend losses for filtering out higher-order modes while leaving substantially intact a fundamental mode, chirally coupled core (3C) fibers having a straight central core with another core which is helically wound around the central core to filter out higher-order modes while leaving the fundamental mode unaffected, longitudinally tapered fiber and/or leakage channel fibers whose core is surrounded by a small number of large holes causing propagation modes to be leaky in order to filter out higher-order modes without substantially impacting the fundamental mode. As defined in RP Photonics Encyclopedia: standard single-mode fibers have an effective mode area below 100 $\mu m^2$ whereas large mode area fibers reach values of hundreds or even thousands of $\mu m^2$. Large mode area single mode fiber core diameters are much larger than conventional single mode fibers. Thus, one can achieve much larger magnitude of feedback using a large mode area single mode fiber rather than standard single mode fiber. The magnitude of the feedback scales with area so 25×, 80× and >100× feedback is possible with core diameters of 30 µm, 55 µm and 80 µm, respectively.

Figure 3A:
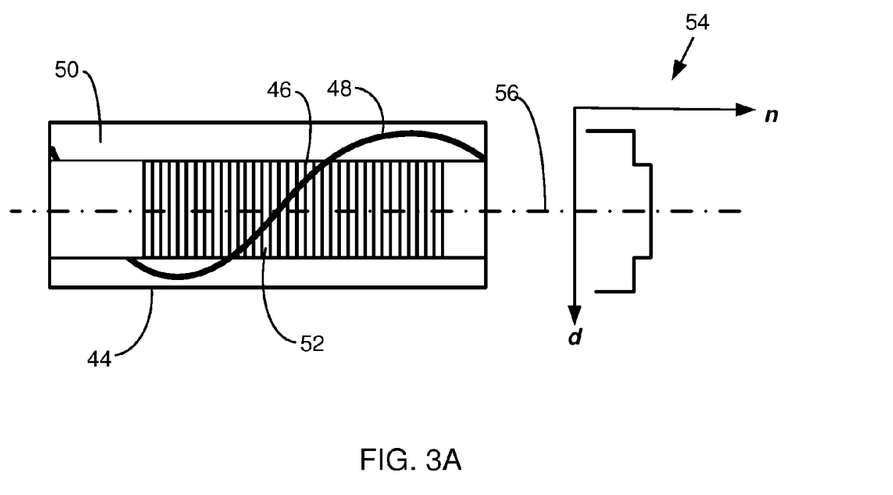
FIG. 3A is a side cutaway view of an optical fiber and associated refractive index profile in accordance with an aspect of the present disclosed technology.

FIG. 3A depicts an example of a single or dual-clad large mode area fiber 44 shown in cross-section configured for injection-locking multiple multimode semiconductor laser gain blocks in an external cavity configuration for emission bandwidth narrowing and/or wavelength locking using a large core single mode fiber 44. In an example, fiber 44 is a fiber, however, fiber 44 may comprise any of a variety of large mode area fibers including leakage channel fibers, rod-type photonic crystal fibers, large core fibers with bend or taper induced higher order mode filtering and/or the like or any combinations thereof. Fiber 44 includes a core 46 longitudinally disposed in a middle of fiber 44. Core 46 is surrounded by a side core 48. Side core 48 is disposed in cladding layer 50 and is wound around core 46 in a helical shape. Side core 48 is configured for coupling higher order modes and allowing essentially single mode propagation in core 46. Fiber 44 includes fiber Bragg grating 52 embedded in central core 46. Fiber Bragg grating 52 is not embedded in side core 48 or cladding 50. Fiber Bragg grating 52 has a reflectivity characteristic such that it is operable to selectively reflect light of a particular wavelength or wavelength ranges that is incident thereon. To the right of fiber 44 in FIG. 3A is a sideways oriented plot of an example cross-sectional refractive index profile 54 of fiber 44 along an axis transverse to a longitudinal axis 56 of fiber 44. Plot 54 shows the refractive index profile across the diameter of fiber 44 but does not include the side core. The example refractive index profile 54 is exaggerated to show the differences between the core 46 and cladding 50 including side core 48. Fiber 44 may be single, dual or triple clad.

In an example, fiber Bragg grating 52 can be written in the center core 46. In some examples, the pitch of the side core 48 is about 5.0 mm to about 10.0 mm. An embedded fiber Bragg grating 52 in this length range may be sufficient for nearly 100% reflection. If fiber Bragg grating 52 does not supply nearly 100% reflection then multiple FBGs can be concatenated.

Figure 3B:
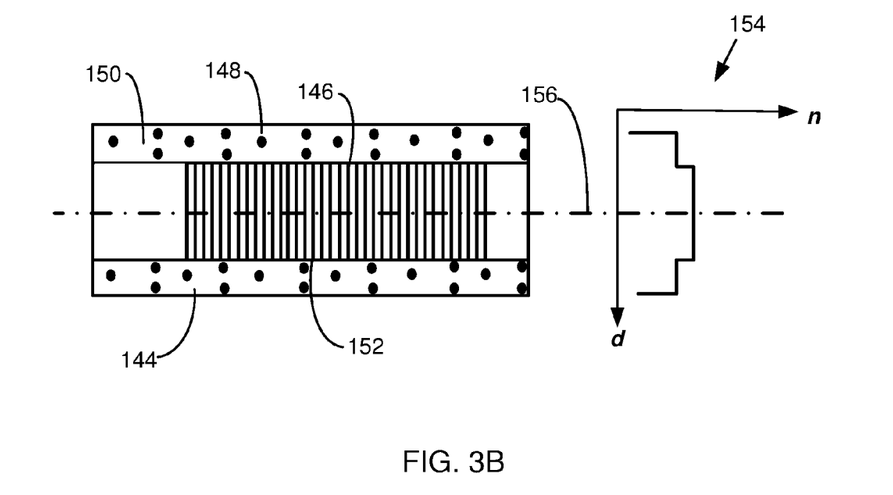
FIG. 3B is a side cutaway view of an optical fiber and associated refractive index profile in accordance with an aspect of the present disclosed technology.

FIG. 3B depicts an example of a large mode area fiber 144 shown in cross-section configured for injection-locking multiple multimode semiconductor laser gain blocks in an external cavity configuration for emission bandwidth narrowing and/or wavelength locking using a large core single mode fiber 144. In an example, fiber 144 is a leakage channel fiber. Fiber 144 includes a core 146 longitudinally disposed in a middle of fiber 144. Core 146 is surrounded by and area containing holes along the longitudinal direction 148 making all propagation modes leaky such that substantially all higher-order modes but not the fundamental mode experience propagation losses. Thus, light propagating in core 146 is essentially single mode. Holes 148 are disposed in cladding layer 150 and may be a variety of sizes, shapes and may vary in number. Fiber 144 includes fiber Bragg grating 152 embedded in central core 146. Fiber Bragg grating 152 is not embedded in holes 148 or cladding 150. Fiber Bragg grating 152 has a reflectivity characteristic such that it is operable to selectively reflect light of a particular wavelength or wavelength ranges that is incident thereon. To the right of fiber 144 in FIG. 3B is a sideways oriented plot of an example cross-sectional effective refractive index profile 154 of fiber 144 along an axis transverse to a longitudinal axis 156 of fiber 144. Plot 154 shows the effective refractive index profile across the diameter of fiber 144. The example refractive index profile 154 is exaggerated to show the differences between the core 146 and cladding 150 including holes 148. An embedded fiber Bragg grating 152 may be of a length selected to provide nearly 100% reflection. If fiber Bragg grating 152 does not supply nearly 100% reflection then multiple FBGs can be concatenated.

Figure 3C:
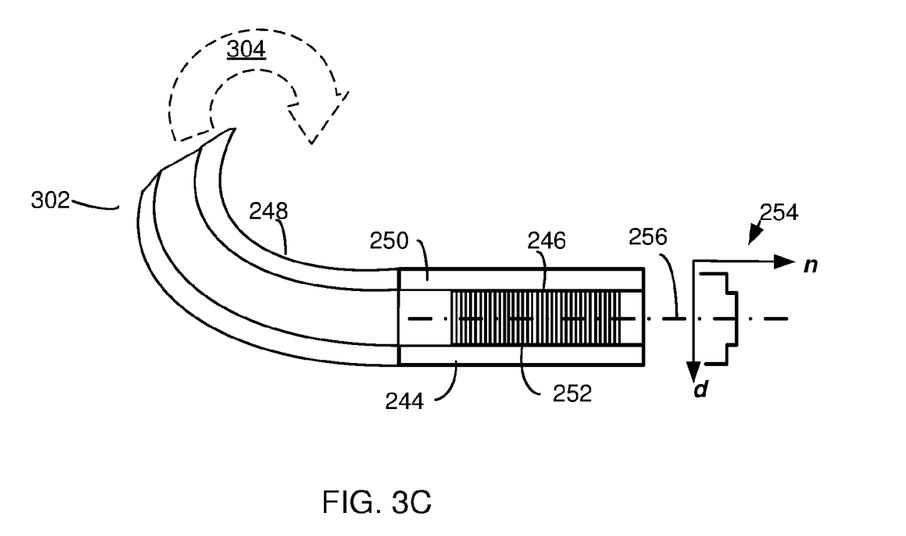
FIG. 3C is a side cutaway view of an optical fiber and associated refractive index profile in accordance with an aspect of the present disclosed technology.

FIG. 3C depicts an example of a large mode area fiber 244 shown in cross-section configured for injection-locking multiple multimode semiconductor laser gain blocks in an external cavity configuration for emission bandwidth narrowing and/or wavelength locking using a large core single mode fiber 244. Core 246 is longitudinally disposed in a middle of fiber 244. Core 246 is surrounded by cladding 250 and includes one or more bends 248 along the longitudinal axis to filter higher order modes such that substantially all higher-order modes but not the fundamental mode experience propagation losses. Thus, light propagating in core 246 is essentially single mode. Bends 248 may be a variety of sizes, shapes and may vary in number. Fiber 244 includes fiber Bragg grating 252 embedded in central core 246. Fiber Bragg grating 252 is not embedded in cladding 250. Fiber Bragg grating 252 has a reflectivity characteristic such that it is operable to selectively reflect light of a particular wavelength or wavelength ranges that is incident thereon. To the right of fiber 244 in FIG. 3C is a sideways oriented plot of an example cross-sectional refractive index profile 254 of fiber 244 along an axis transverse to a longitudinal axis 256 of fiber 244. Plot 254 shows the effective refractive index profile across the diameter of fiber 244. The example refractive index profile 254 is exaggerated to show the differences between the core 246 and cladding 250. An embedded fiber Bragg grating 252 may be of a length selected to provide nearly 100% reflection. If fiber Bragg grating 252 does not supply nearly 100% reflection then multiple FBGs can be concatenated within fiber 244. Bends 248 may make one or more complete revolutions 304 creating one or more coils. The input coupling occurs from a bent or coiled side 302. In this way, the higher order mode stripping occurs before light reaches fiber Bragg grating 252.

Figure 3D:
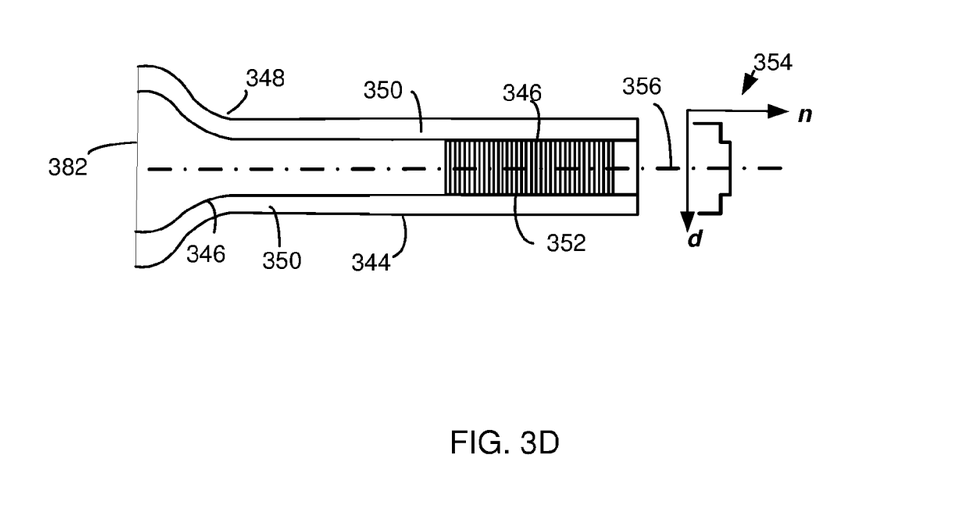
FIG. 3D is a side cutaway view of an optical fiber and associated refractive index profile in accordance with an aspect of the present disclosed technology.

FIG. 3D depicts an example of a large mode area fiber 344 shown in cross-section configured for injection-locking multiple multimode semiconductor laser gain blocks in an external cavity configuration for emission bandwidth narrowing and/or wavelength locking using a large core single mode fiber 344. Core 346 is longitudinally disposed in a middle of fiber 344. Core 346 is surrounded by cladding 350 and includes a tapered section 348 along the longitudinal axis to filter higher order modes such that substantially all higher-order modes but not the fundamental mode experience propagation losses. The input coupling occurs from the tapered side 382. Tapered section 348 decreases in diameter from input side 382. Thus, light propagating in core 346 is essentially single mode. Taper 348 may be a variety of sizes, shapes and may vary in waist diameter. Fiber 344 includes fiber Bragg grating 352 embedded in central core 346. Fiber Bragg grating 352 is not embedded in cladding 350. Fiber Bragg grating 352 has a reflectivity characteristic such that it is operable to selectively reflect light of a particular wavelength or wavelength ranges that is incident thereon. To the right of fiber 344 in FIG. 3D is a sideways oriented plot of an example cross-sectional refractive index profile 354 of fiber 344 along an axis transverse to a longitudinal axis 356 of fiber 344. Plot 354 shows the effective refractive index profile across the diameter of fiber 344. The example refractive index profile 354 is exaggerated to show the differences between the core 346 and cladding 350. An embedded fiber Bragg grating 352 may be of a length selected to provide nearly 100% reflection. If fiber Bragg grating 352 does not supply nearly 100% reflection then multiple FBGs can be concatenated within fiber 344.

Figure 4:
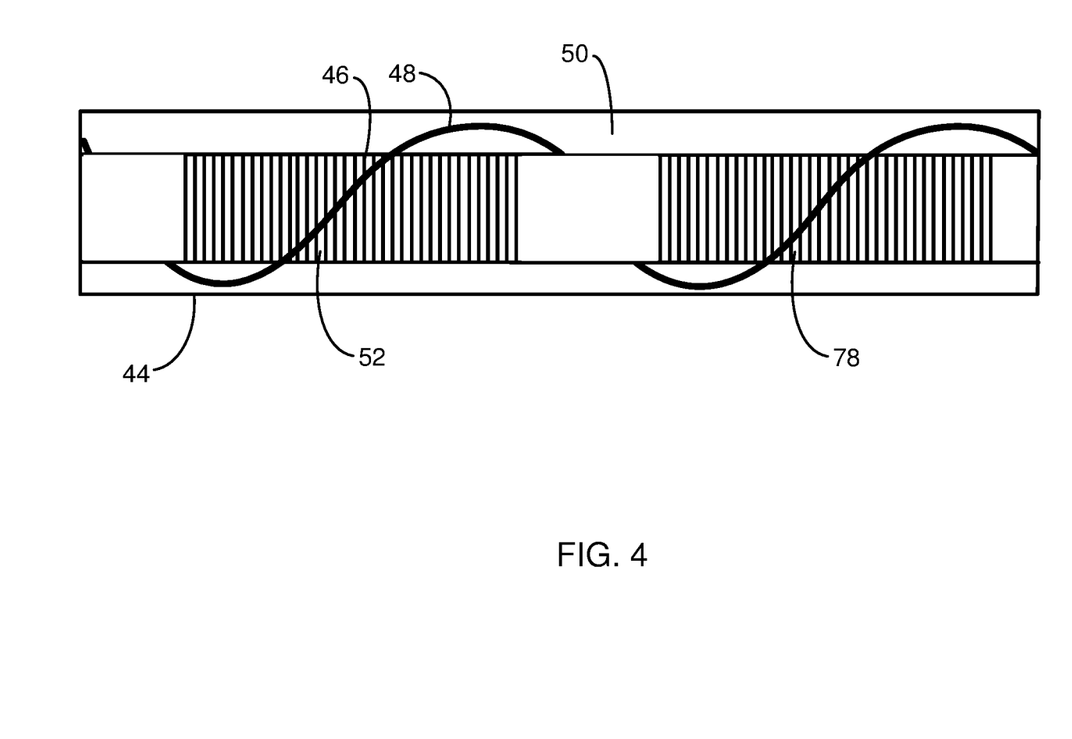
FIG. 4 is a side cross-sectional view of an optical fiber in accordance with an aspect of the present disclosed technology.

FIG. 4 illustrates an example of a large mode area fiber 44 shown in cross-section configured for injection-locking multiple multimode semiconductor laser gain blocks including concatenated fiber Bragg gratings. Additional FBGs may be concatenated in order to achieve nearly 100% reflection.

Figure 5:
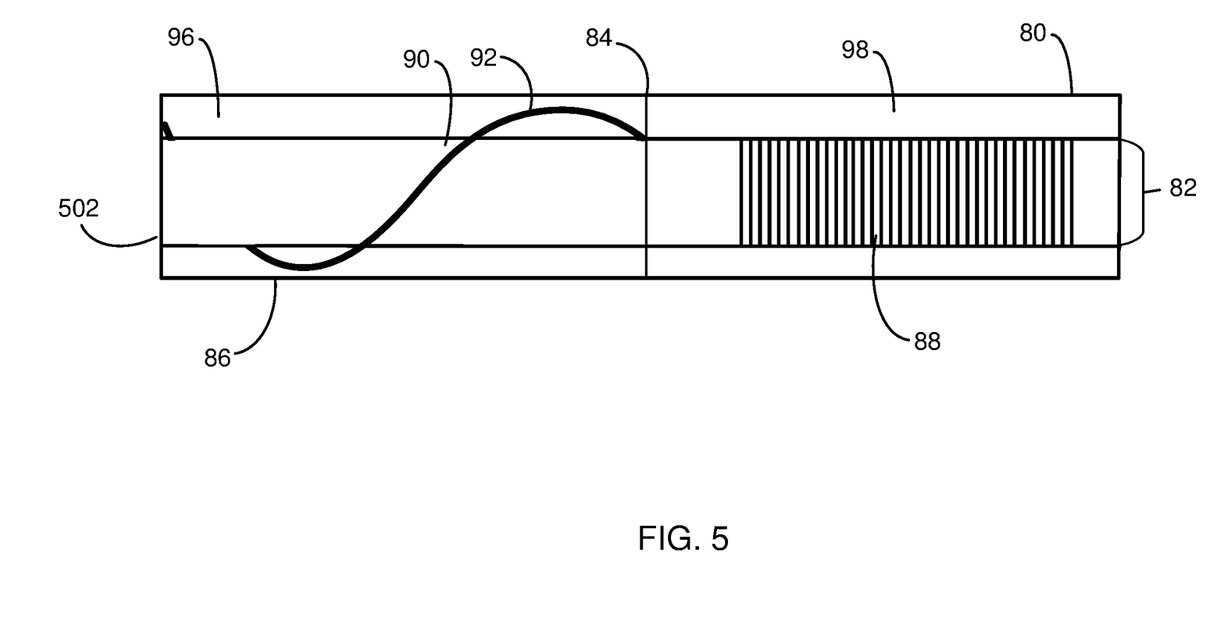
FIG. 5 is a side cross-sectional view of an optical fiber in accordance with an aspect of the present disclosed technology.

FIG. 5 illustrates an example of a large mode area chirally coupled core fiber 86 spliced to a large mode area passive fiber 80 configured for injection-locking multiple multimode semiconductor laser gain blocks in an external cavity configuration for emission bandwidth narrowing and/or wavelength locking using a large core single mode fiber. In an example, large mode area chirally coupled core fiber 86 does not have a fiber Bragg grating and is spliced to a passive fiber 80 that has a very large core 82 into which a fiber Bragg grating 88 is written. The dimensions of passive fiber 80 substantially match the dimensions of fiber 86. More specifically, the diameter of fiber core 90 is substantially the same as the diameter of passive fiber core 82. The diameter of fiber cladding 96 is substantially the same as the diameter of the outer cladding 98 of passive fiber 80. In this example, fiber Bragg grating 88 may be configured to provide nearly 100% reflection. Input coupling occurs from the chirally coupled core side 502 so that mode stripping can occur before the light encounters the fiber Bragg grating 88. The index contrast generated in the Bragg grating 88 and by the length of the grating determine the magnitude of the reflection. The higher the index contrast and longer the grating 88, the higher the magnitude of reflected power.

A wide variety of other configurations of large core large mode area fibers including embedded fiber Bragg gratings to enable injection-locking of multiple multimode semiconductor laser gain blocks in an external cavity configuration for emission bandwidth narrowing and/or wavelength locking are contemplated. For the sake of simplicity and clarity all possible configurations and variations are not shown.

Figure 6:
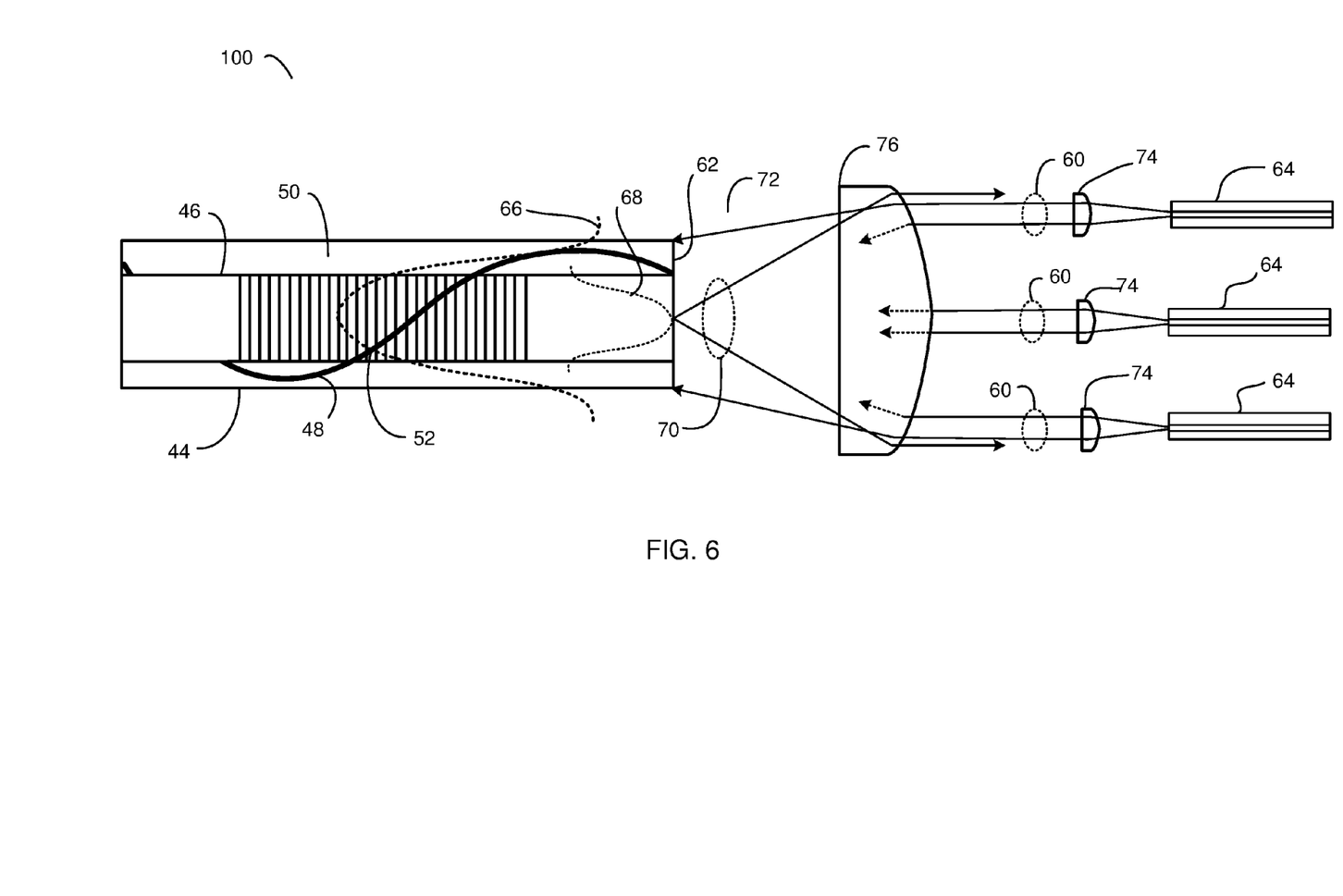
FIG. 6 is a schematic of a wavelength locked laser system in accordance with another aspect of the present disclosed technology.

FIG. 6 is a schematic of a wavelength selective assembly 100 configured to enable injection-locking of multiple multimode semiconductor laser gain blocks. Wavelength selective apparatus 100 includes large core, single mode fiber 44. Fiber 44 is illustrated in FIG. 6 as a chirally coupled core (3C) fiber. However, other large mode area fibers known to those of skill in the art and/or described hereinabove may replace fiber 44 in assembly 100 and claimed subject matter is not limited in this regard.

In an example, fiber 44 is disposed to receive multimode semiconductor laser beams 60 optically coupled into a fiber input surface 62 of fiber 44. Semiconductor laser beams 60 are produced by optical sources, such as single-emitter semiconductor diode lasers gain blocks 64. Guided by total internal reflection, multimode light 66 that has been coupled into the fiber 44, is designated generally by left facing dashed lines. Fiber Bragg grating 52 is disposed in core 46. Fiber Bragg grating 52 has a narrow reflection band less than about 1 nm and is operable to reduce the bandwidth of the optical sources providing the semiconductor laser beams 60, which is typically 2 nm to 3 nm wide in a Fabry-Perot configuration. Multimode light 66 propagates through core 46 and cladding 50. Higher order modes of the multimode light 66 that are coupled inside core 46 are then stripped by side core 48. Filtering out higher order modes in this way essentially leaves single mode light in core 46. This takes a short distance for the stripping of the higher order mode. So typically, the fiber Bragg grating 52 is located a distance away from the input fiber face 62 but this is not necessary, as long as the fiber Bragg grating 52 is long enough for the stripping to occur and provide high reflectivity.

In an example, core 46 is a large mode area with several modes in the core (e.g., >2 modes). In an example, core 46 may include multiple fiber Bragg gratings concatenated in order to achieve 100% reflection as depicted in FIG. 4. In other examples, core 46 may not include a fiber Bragg grating, rather core 46 may be coupled to a large core passive fiber including a fiber Bragg grating as depicted in FIG. 5. In these large mode area configurations an input side 62 will have the mode filtering piece first (i.e., side core 48) followed by the fiber Bragg grating 52.)

In an example, core 46 is large enough to be multimode. By locating the fiber Bragg grating 52 in core 46, a non-degenerate Bragg condition may be enabled. Multimode laser light 66 that is guided in core 46, side core 48 and/or cladding 50 may have numerous propagation constants and associated effective indexes for various guided optical modes. Each of the guided optical modes may have overlap with central single mode core 46. Therefore, each of the guided optical modes excites a single mode with a single propagation constant inside core 46. Thus, a wavelength of reflected wave 68 (designated generally by a right facing dashed line) from the fiber Bragg grating 52 is determined by the effective index of light inside the single mode core 44 and the pitch of the gratings in fiber Bragg grating 52.

Using a large mode area core 46, the cross-sectional area of core 46 of fiber 44 is a large fraction of the multimode cross-sectional area of cladding 50 and core 46. A corresponding large fraction of light propagating in fiber 44 is converted to single mode light. A fraction of the single mode light is reflected from the fiber Bragg grating 52 to become the reflected (single mode) light 68. Thus, increasing the area (i.e. the total fraction of reflected light), enables more light to be fed back compared to smaller mode area configurations, whereby the core is nearly single mode; hence, smaller. Higher reflection allows better locking and higher discrimination over the Fabry-Perot modes of the gain block. This means the large mode area configuration disclosed herein provides locking over larger operating conditions. Furthermore, the reflected beam 70 is single mode not few moded. So the spectrum is as narrow as it can be. If more modes are reflected, the spectrum broadens.

In an example, reflected wave 68 has a narrow spectral band attributable to the characteristics of the fiber Bragg grating 52 and has a essentially single spatial transverse mode due to the filtering effect of aforementioned 3C fiber or coiled LMA fibe or tapered fiber or leakage fibers. Reflected wave 68 is then emitted from the input surface 62 of fiber 44 as a narrow band single mode beam 70. Single mode beam 70 is shown with marginal rays thereof having right facing arrows. A multimode light beam 72, which is coupled into the input surface 62 of fiber 44, is shown with outer marginal rays thereof having left facing arrows at the input surface 62. The multimode light beam 72 typically includes a plurality of multimode light beams 60, emitted by the respective multimode semiconductor laser gain blocks 64, in single-emitter, bar, or other configuration. By coupling a portion or the entire reflected wave 68, which has a narrower spectral band, into the corresponding gain blocks 64, the wavelengths of light emitted by the gain blocks 64 can be locked. Herein wavelength locking refers to the narrowing of a spectral band of associated gain blocks in an unlocked configuration and also to selecting or adjusting the wavelength of the corresponding light emitted by associated gain blocks.

In many examples multimode light beams 60 are collimated across one or more transverse propagation axes by collimation optics 74, such as cylindrical lens slow axis collimators and/or fast axis collimators. The multimode light beams 60 are coupled into the input surface 62 of fiber 44 with a Fourier transform lens 76, such as an objective lens. In some examples, other optics devices may be used for coupling light beams 60 into fiber 44 and for coupling reflected wave 68 back to diode lasers 64. In some examples, lasers 64 may be multi-emitter devices.

The narrow band single mode beam 70 emitted from the input surface 62 is optically coupled to the lens 76 and is Fourier transformed to provide feedback to multiple multimode semiconductor laser gain blocks 64. For example, portions of the single mode beam 70 are received by the collimation optics 74 and coupled into anti-reflective coated input facets of the gain blocks 64. Other portions of the single mode beam 70 may miss the collimation optics 74 and not get coupled into the gain blocks 64. The back facets of the semiconductor laser gain blocks 64 are preferably highly reflectively coated. The input surface 62 is preferably anti-reflective coated. The diode laser beams 60 can be of arbitrary size depending on the telescopes used. Moreover, various diode configurations are possible, such as reflected, multiplexed, etc., and different coupling methods are appreciated to be within the scope of aspects of the disclosed technology.

Accordingly, assembly 100 may achieve wavelength locking of semiconductor laser gain blocks 64 by back-reflecting a portion of the light emitted therefrom with one or more fiber Bragg gratings 52 disposed in core 46 of a section of LMA fiber 44. A portion of the back-reflected light is coupled back into the gain blocks 64 which adjust wavelengths of light being emitted therefrom responsive to receiving the back-reflected light beams 70. As is well known to those skilled in the art, the Bragg grating pitch and the effective index of the fiber determine the locking wavelength. LMA fibers in accordance with aspects of the present disclosed technology are configured with a large mode area core 46, perhaps a side core 48 and a cladding 50 surrounding the core 46. In some examples the core 46 may be offset or have different shapes. The core 46 has a fiber Bragg grating 52 disposed therein, which can be achieved through conventional methods of writing periodic shapes in the core 46. The fiber Bragg grating 52 is thus configured to reflect a portion of pump light propagating in the direction of fiber 44 so as to propagate reflected portion backwards through the large core 46 and back into associated gain blocks 64 for locking or narrowing the wavelength of light emitted therefrom.

Thus, in some examples, multimode light emitted by diode laser gain blocks 64 is collimated and incident on a Fourier transform lens 74. This light is coupled into a multimode fiber 44 to be used as pump light for various applications, such as solid state laser or fiber laser pumping. The guided modes of the pump light propagating in the optical fiber 44 have an overlap with the large mode area core 46 of the fiber 44. Therefore, single mode pump light is generated inside the core 46 in the forward direction. The single mode pump light encounters one or more fiber Bragg gratings (FBG 52 and/or FBG 78) in the large area mode core 46 and a portion thereof is reflected to become backwards propagating single mode pump light. The backwards propagating single mode pump light 70 is then emitted from fiber 44 and is optically coupled via the Fourier transform lens 76 and collimation optics 74 back into the diode laser gain blocks 64. Since the spectral width of the backwards propagating light is narrow, e.g., less than 1 nm or narrower, as determined by the characteristics of the one or more fiber Bragg gratings, the diode gain blocks 64 become injection locked to the center wavelength of the one or more fiber Bragg gratings. Thus, wavelength locking of gain blocks 64 can be achieved without the use of conventional externally or internally disposed elements, such as volume Bragg gratings or distributed feedback elements. Use of such elements can typically experience undesirable heating which can result in wavelength drift of the locked wavelength of the gain blocks 64 as a function of temperature or diode power. For example, in externally disposed VBG arrangements, as diode powers increase from just a few Watts to tens or several tens of Watts, the VBG element increases in temperature and the locked wavelength of the gain blocks 64 becomes longer and the linewidth broadens, typically in the range of picometers to hundreds of picometers. Thus, elimination of such elements that experience heating can also eliminate or mitigate the wavelength drift associated therewith.

It is thought that the present disclosed technology and many of the attendant advantages thereof will be understood from the foregoing description and it will be apparent that various changes may be made in the parts thereof without departing from the spirit and scope of the disclosed technology or sacrificing all of its material advantages, the forms hereinbefore described being merely exemplary embodiments thereof.

What is claimed is:

1. A diode laser assembly, comprising:
    an optical fiber having a cladding and a large mode area (LMA) core, wherein the LMA core comprises a fiber Bragg grating disposed within the LMA core and not in the cladding;
    a plurality of diode lasers configured to emit light;
    optics configured to receive the light and to couple the light into the LMA core; and
    one or more features in the optical fiber to couple higher order modes of the light leaving substantially single mode light to propagate in the LMA core;
    wherein a portion of the single mode light propagating in the LMA core is reflected by the fiber Bragg grating and is coupled back through the optics into the plurality of diode lasers to lock the wavelength of light emitted from each diode laser of the plurality.

2. The assembly of claim 1, wherein the portion of light reflected by the fiber Bragg grating is proportional to the ratio of the diameter of the LMA core to the diameter of the optical fiber.

3. The assembly of claim 1 wherein the plurality of diode lasers are wavelength locked at a center wavelength of the fiber Bragg grating and with a full width half maximum of greater than 0 nm and less than 1 nm.

4. The assembly of claim 1, wherein the portion of light that is reflected by the core fiber Bragg grating is between 0.1% and 20% percent of the light coupled into the optical fiber.

5. The assembly of claim 1 wherein the plurality of diode lasers comprises a plurality of single-emitter diode lasers.

6. The assembly of claim 1, wherein the portion of light that is reflected by the LMA core fiber Bragg grating and is coupled into the plurality of diode lasers is not equally distributed among each of the diode lasers.

7. The assembly of claim 1, wherein the plurality of diode lasers comprises a bar of diode lasers.

8. The assembly of claim 1, wherein the optical fiber includes a plurality of fiber Bragg gratings concatenated in the LMA core.

9. The assembly of claim 1, wherein the optical fiber includes a side core wound in a helix around the LMA core to couple out higher order modes of the light.

10. The assembly of claim 1, wherein the optical fiber includes holes distributed around the LMA core to couple out higher order modes of the light.

11. The assembly of claim 1, wherein the optical fiber is tapered to couple out higher order modes of the light.

12. The assembly of claim 1, wherein the optical fiber is bent to induce higher order mode losses.

13. The assembly of claim 1, wherein the optical fiber includes a first section comprising a side core wound in a helix around the LMA core to couple higher order modes of the light and a second section comprising a fiber having a LMA core, wherein the fiber Bragg grating is written into the LMA core and not in the LMA core in the first section.

14. The assembly of claim 1, wherein the optical fiber includes a first section comprising a tapered portion, wherein the tapered portion is on an input side and tapers from a larger diameter to a smaller diameter to couple out higher order modes of the light and a second section comprising a fiber having a LMA core, wherein the fiber Bragg grating is written into the LMA core and not in the LMA core in the first section.

15. The assembly of claim 1, wherein the optics includes a fast axis collimator and slow axis collimator optically coupled to each diode laser of the plurality of diode lasers for collimating the laser beams emitted therefrom, and the optics include a Fourier transform lens for receiving the collimated laser beams and coupling the laser beams into an input face of the optical fiber.

16. The assembly of claim 1 wherein the fiber Bragg grating has a reflectivity spectrum of greater than 0 nm and less than or equal to 1 nm.

17. The assembly of claim 1 wherein the optical fiber provides wavelength locking of the plurality of diode lasers without wavelength drift at incident powers.

18. The assembly of claim 1 wherein the core is a single mode or few mode core.

* * * * *